US012106967B2

(12) United States Patent
Hirata

(10) Patent No.: US 12,106,967 B2
(45) Date of Patent: Oct. 1, 2024

(54) WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 596 days.

(21) Appl. No.: 17/451,682

(22) Filed: Oct. 21, 2021

(65) Prior Publication Data

US 2022/0148881 A1     May 12, 2022

(30) Foreign Application Priority Data

Nov. 10, 2020   (JP) ................................. 2020-186938

(51) Int. Cl.

| | | |
|---|---|---|
| *H01L 21/304* | (2006.01) | |
| *B23K 26/38* | (2014.01) | |
| *B23K 26/53* | (2014.01) | |
| *B23K 101/40* | (2006.01) | |
| *H01L 21/04* | (2006.01) | |
| *H01L 21/67* | (2006.01) | |

(52) U.S. Cl.
CPC .......... *H01L 21/3043* (2013.01); *B23K 26/38* (2013.01); *B23K 26/53* (2015.10); *H01L 21/0445* (2013.01); *H01L 21/67092* (2013.01); *B23K 2101/40* (2018.08)

(58) Field of Classification Search
CPC ............. H01L 21/3043; H01L 21/0445; H01L 21/67092; H01L 21/02013; H01L 21/02021; H01L 21/0201; B23K 26/38; B23K 26/53; B23K 2101/40; B23K 26/032; B23K 26/3576; B23K 2103/50; B23K 26/36; B23K 26/362
See application file for complete search history.

(56) References Cited

FOREIGN PATENT DOCUMENTS

| | | |
|---|---|---|
| JP | 2000094221 A | 4/2000 |
| JP | 2016111143 A | 6/2016 |
| JP | 2020017627 A | 1/2020 |
| JP | 2020102521 A | 7/2020 |
| JP | 2020113664 A | 7/2020 |
| JP | 2020145418 A | 9/2020 |

OTHER PUBLICATIONS

Office Action issued in counterpart Japanese patent application No. 2020-186938, dated Jun. 18, 2024.
Search report issued in counterpart Singapore patent application No. 10202111894T, dated Dec. 26, 2022.

*Primary Examiner* — Robert G Bachner
(74) *Attorney, Agent, or Firm* — Greer Burns & Crain Ltd.

(57) ABSTRACT

A peeling layer is formed by applying a laser beam only to a central region of a workpiece other than a peripheral region extending inward from the peripheral edge of the workpiece by a predetermined distance. In this case, the application of the laser beam does not form the peeling layer in the peripheral region of the workpiece, and the formation of an ablation trace on the outer peripheral surface of the workpiece is prevented. As a result, it is possible to reduce a probability of occurrence of chipping in the peripheral region of a wafer peeled off from the workpiece when the wafer is subjected to a post-process.

8 Claims, 10 Drawing Sheets

WAFER PRODUCING METHOD

BACKGROUND OF THE INVENTION

Field of the Invention

The present invention relates to a wafer producing method.

Description of the Related Art

Chips of semiconductor devices are generally manufactured by using a disk-shaped wafer. This wafer is, for example, cut out from a cylindrical semiconductor ingot by using a wire saw, and thereafter produced by polishing the top surface of the wafer and thus finishing the top surface into a mirror surface (see Japanese Patent Laid-Open No. 2000-94221, for example).

Specifically, when the wafer is cut out from the ingot by using the wire saw, minute irregularities are formed on the top surface of the wafer, and the wafer is curved as a whole (a warp occurs in the wafer). Therefore, the top surface of the wafer thus cut out is often polished in order to planarize the wafer by removing the irregularities.

However, when the wafer is polished, a part of the polished surface side of the wafer becomes a polishing swarf and is discarded, so that the wafer is thinned. In consideration of this, the wafer is generally cut out from the ingot so as to be thicker than a wafer used for manufacturing semiconductor devices.

The ingot used for manufacturing chips of semiconductor devices is expensive. Therefore, when the wafer is produced by a method necessitating polishing, the manufacturing cost of the chips of the semiconductor devices manufactured by using the wafer also tends to be high.

Further, single crystal silicon carbide (SiC) expected as a material for power devices has high hardness. Therefore, when a wafer is cut out from a single crystal SiC ingot by using the wire saw, a time required to cut out the wafer tends to be long, and the wire saw tends to be worn.

As a result, the manufacturing cost of the single crystal SiC wafer tends to be high. In view of this, a method has been developed which peels the wafer from the ingot by using a laser beam without using the wire saw (see Japanese Patent Laid-Open No. 2016-111143, for example).

This method irradiates the ingot with the laser beam in a state in which the condensing point of the laser beam having a wavelength passing through the ingot is positioned within the ingot. A peeling layer including a modified layer and cracks extending from the modified layer is thereby formed within the ingot. Then, the wafer is peeled from the ingot by separating the ingot at the peeling layer.

SUMMARY OF THE INVENTION

In the above-described method, a chuck table that holds the ingot moves linearly such that a part from one end to another end of the ingot passes directly below a condenser (laser head) while a laser beam irradiating unit applies the laser beam to a position directly below the condenser.

Here, the power of the laser beam at the condensing point may not be stable when the vicinity of one end and the vicinity of another end (peripheral region) of the ingot are irradiated with the laser beam. In the following, this will be described with reference to FIGS. 10A to 10E. Incidentally, FIGS. 10A to 10E are diagrams illustrating states in which the vicinity of one end of an ingot 1 is irradiated with a laser beam 3 while the chuck table holding the ingot 1 is moved.

When the vicinity of one end of the ingot 1 is to be irradiated with the laser beam 3, as illustrated in FIG. 10A, the condensing point of the laser beam 3 is positioned at a height corresponding to the inside of the ingot 1 in a state in which an optical axis 5 of the laser beam 3 is sufficiently separated outward from the outer peripheral surface of the ingot 1.

When the chuck table is moved until the optical axis 5 is positioned slightly outward of the outer peripheral surface of the ingot 1, as illustrated in FIG. 10B, a part of the laser beam 3 passes through the upper surface of the ingot 1. Incidentally, due to a difference in refractive index between the ingot 1 and an atmosphere, there is a difference between the height of the condensing point of the laser beam 3 passing through the inside of the ingot 1 and the height of the condensing point of the laser beam 3 not passing through the inside of the ingot 1.

When the chuck table is moved until the optical axis 5 is positioned at the outer peripheral surface of the ingot 1, as illustrated in FIG. 10C, about half of the laser beam 3 which half is on a side adjoining the ingot 1 passes through the upper surface of the ingot 1. Incidentally, as described above, the height of the condensing point of the laser beam passing through the inside of the ingot 1 is different from the height of the condensing point of the laser beam 3 not passing through the inside of the ingot 1.

When the chuck table is moved until the optical axis 5 is positioned slightly inward of the outer peripheral surface of the ingot 1, as illustrated in FIG. 10D, a part of the laser beam 3 goes to the condensing point within the ingot 1 via the outer peripheral surface of the ingot 1. At this time, an ablation trace resulting from multiphoton absorption is formed on the outer peripheral surface of the ingot 1. Incidentally, as in the foregoing, the height of the condensing point of the laser beam 3 passing through the outer peripheral surface of the ingot 1 is different from the height of the condensing point of the laser beam 3 passing through the upper surface of the ingot 1.

When the chuck table is moved until the optical axis 5 is sufficiently separated inward from the outer peripheral surface of the ingot 1, as illustrated in FIG. 10E, the whole of the laser beam 3 passes through the upper surface of the ingot 1. At this time, the whole of the laser beam 3 goes to a single condensing point within the ingot 1. Therefore, the power density of the laser beam 3 at the condensing point within the ingot 1 at this time is highest in a period from when the condensing point of the laser beam 3 is positioned at the outer peripheral surface of the ingot 1 (see FIG. 10C) to this time (see FIG. 10E).

In addition, also when the chuck table is moved such that another end of the ingot 1 is irradiated with the laser beam 3, an ablation trace resulting from multiphoton absorption is similarly formed on the outer peripheral surface of the ingot 1, and the power density of the laser beam 3 at the condensing point within the ingot 1 changes.

In a case where the vicinity of one end and the vicinity of another end (peripheral region) of the ingot 1 are thus irradiated with the laser beam 3 and the ablation traces are formed on the outer peripheral surface of the ingot 1, there is a fear of chipping occurring in the peripheral region of the wafer in a post-process (grinding, chemical mechanical polishing (CMP)), edge trimming, chamfering, or the like) performed on the wafer peeled off from the ingot 1.

In view of this, it is an object of the present invention to provide a wafer producing method that can reduce a probability that chipping occurs in the peripheral region of a wafer in a post-process.

In accordance with an aspect of the present invention, there is provided a wafer producing method for producing, from a workpiece that is a single crystal SiC ingot or a single crystal SiC wafer and has a first surface and a second surface opposed to the first surface, a wafer having a thickness less than an interval between the first surface and the second surface. The wafer producing method includes a peeling layer forming step of positioning, within the workpiece, a condensing point of a laser beam of a wavelength passing through the workpiece, applying the laser beam while moving the workpiece and the condensing point relative to each other along an intersection line at which a plane parallel with a c-plane of the workpiece and the first surface intersect each other, and forming a peeling layer including a modified portion and a crack extending from the modified portion along the c-plane, and a wafer peeling step of peeling the wafer from the workpiece by separating the workpiece at the peeling layer, the peeling layer forming step applying the laser beam only in a state in which the condensing point is positioned in a central region of the workpiece other than a peripheral region extending inward from a peripheral edge of the workpiece by a predetermined distance.

Preferably, the wafer producing method further includes a peripheral edge detecting step of detecting the peripheral edge of the workpiece by imaging the first surface side of the workpiece by an imaging unit before the peeling layer forming step.

Preferably, the wafer producing method further includes a grinding step of grinding a peeling surface of the wafer, the peeling surface being exposed by peeling the wafer from the workpiece, after the wafer peeling step.

Preferably, the wafer producing method further includes a chamfering step of chamfering the peripheral edge of the wafer after the wafer peeling step.

The present invention forms the peeling layer by applying the laser beam only to the central region of the workpiece other than the peripheral region extending inward from the peripheral edge of the workpiece by a predetermined distance. In this case, the application of the laser beam does not form the peeling layer in the peripheral region of the workpiece, and the formation of an ablation trace on the outer peripheral surface of the workpiece is prevented. As a result, it is possible to reduce a probability of occurrence of chipping in the peripheral region of the wafer when the wafer peeled off from the workpiece is subjected to a post-process.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
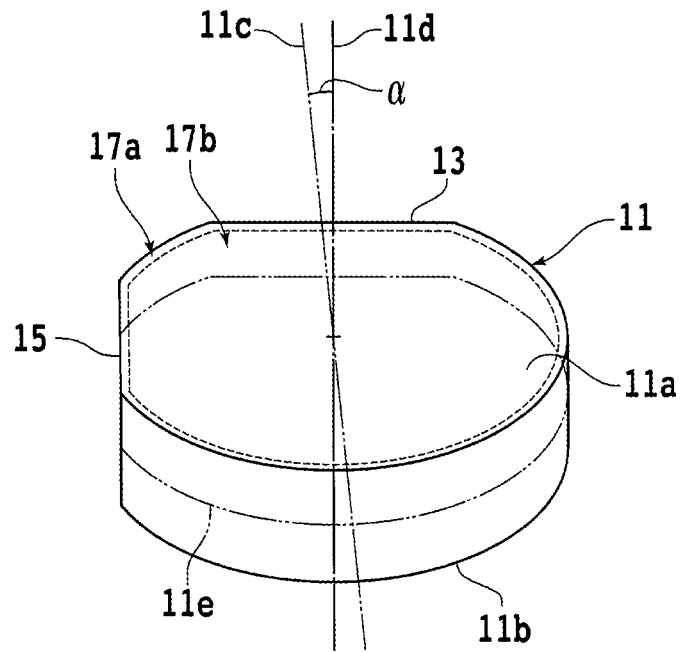
FIG. 1A is a perspective view schematically illustrating an example of a workpiece.
Figure 1B:
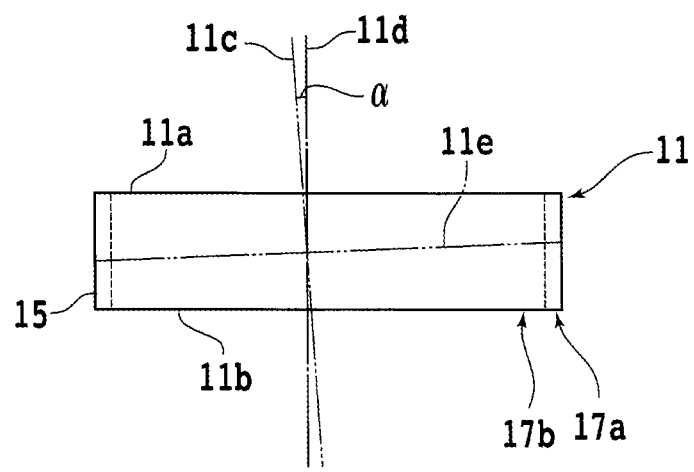
FIG. 1B is a side view schematically illustrating the example of the workpiece.

An embodiment of the present invention will be described with reference to the accompanying drawings. FIG. 1A is a perspective view schematically illustrating an example of a workpiece used in a wafer producing method according to the present embodiment. FIG. 1B is a side view schematically illustrating an example of the workpiece. The workpiece 11 illustrated in FIG. 1A and FIG. 1B is a cylindrical single crystal SiC ingot having a top surface (first surface) 11a and an undersurface (second surface) 11b substantially parallel with each other.

The workpiece 11 is produced by using epitaxial growth. Then, the workpiece 11 is produced such that a c-axis 11c of single crystal SiC is slightly inclined with respect to a normal 11d to the top surface 11a and the undersurface 11b in order to reduce lattice defects formed internally. For example, an angle (off angle) a formed between the c-axis 11c and the normal 11d is 1° to 6° (typically 4°).

Two flat portions indicating the crystal orientation of the single crystal SiC, that is, a primary orientation flat 13 and a secondary orientation flat 15 are formed on a peripheral region of the workpiece 11. Then, the primary orientation flat 13 is longer than the secondary orientation flat 15. In addition, the secondary orientation flat 15 is formed so as to be parallel with an intersection line at which a plane parallel with a c-plane 11e of the single crystal SiC and the top surface 11a or the undersurface 11b intersect each other.

It is to be noted that the workpiece 11 is not limited to the single crystal SiC ingot but may be a single crystal SiC wafer peeled off from the single crystal SiC ingot. In addition, one of or both of the primary orientation flat 13 and the secondary orientation flat 15 may not be provided to the side surface of the workpiece 11.

Further, the workpiece 11 is demarcated into a peripheral region 17a extending inward from the peripheral edge of the workpiece 11 by a predetermined distance and a central region 17b inward of the peripheral region 17a. Incidentally, while a boundary line between the peripheral region 17a and the central region 17b is indicated by a dotted line in FIG. 1A and FIG. 1B, this boundary line is an imaginary line, and does not exist on an actual workpiece 11.

Specifically, the peripheral region 17a is a region in which intentional formation of a peeling layer is not performed in a peeling layer forming step to be described later. On the other hand, the central region 17b is a region in which the intentional formation of a peeling layer is performed in the peeling layer forming step to be described later.

In other words, the peripheral region 17a is a region in which the condensing point of a laser beam applied to form a peeling layer is not positioned in the peeling layer forming step to be described later. On the other hand, the central region 17b is a region in which the condensing point of the laser beam applied to form a peeling layer is positioned in the peeling layer forming step to be described later.

In addition, the width of the peripheral region 17a, that is, an interval between the peripheral edge and the central region 17b of the workpiece 11 is preferably set to be equal to or more than a minimum value of an interval between the condensing point of the laser beam all of which passes through the upper surface of the workpiece 11 and the outer peripheral surface of the workpiece 11. Therefore, the width of the peripheral region 17a may be set depending on the numerical aperture NA of a condensing lens for condensing the laser beam applied to the workpiece 11 and the like.

Figure 2:
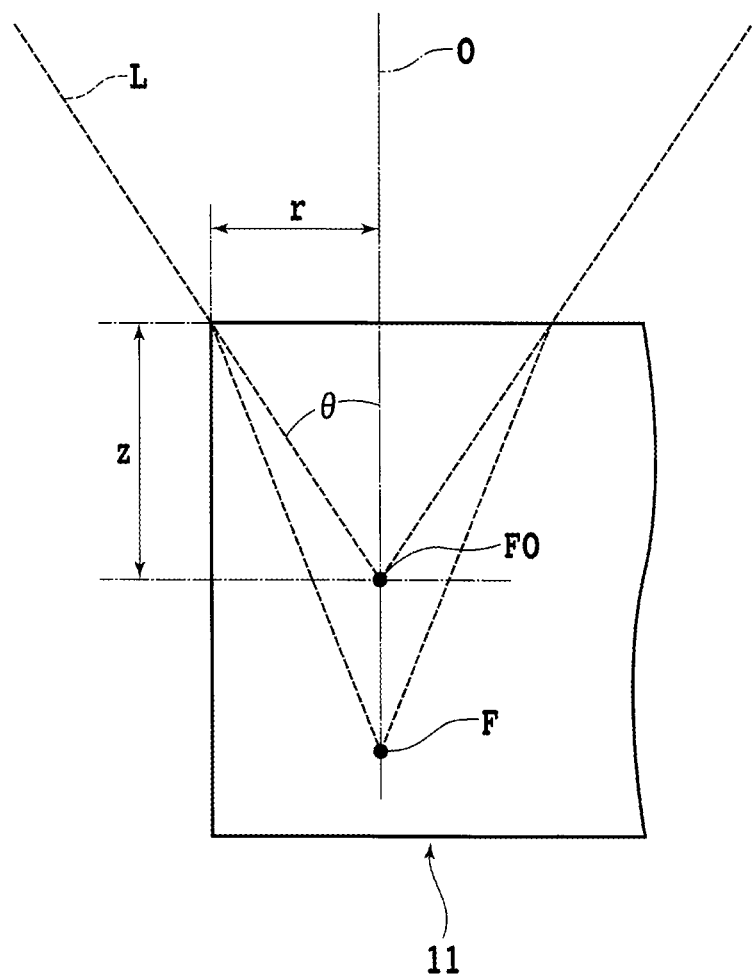
FIG. 2 is a diagram schematically illustrating the workpiece in a state in which a vicinity of one end of the workpiece is irradiated with a laser beam.

This will be described with reference to FIG. 2. Incidentally, FIG. 2 is a diagram schematically illustrating the workpiece 11 in a state in which a vicinity of one end of the workpiece 11 is irradiated with the laser beam. The vicinity of the one end of the workpiece 11 illustrated in FIG. 2 is irradiated with a laser beam L from above. The laser beam L is condensed at a condensing point F located on an optical axis O within the workpiece 11.

In addition, when an interval between the optical axis O of the laser beam L and the outer peripheral surface of the workpiece 11 is equal to or more than r, all of the laser beam L passes through the upper surface of the workpiece 11 without passing through the outer peripheral surface of the workpiece 11. In other words, here, let r be the minimum value of the interval between the condensing point of the laser beam L all of which passes through the upper surface of the workpiece 11 and the outer peripheral surface of the workpiece 11. Therefore, the width of the peripheral region 17a needs to be set to be equal to or more than r in order for the laser beam L not to pass through the outer peripheral surface of the workpiece 11.

Here, letting θ be an angle formed between an imaginary line in a case where the laser beam L traveling in a straight line without being refracted when entering the workpiece 11 and the optical axis O, and letting z be an interval between the upper surface of the workpiece 11 and a point of intersection (imaginary condensing point FO) of the imaginary line and the optical axis O, r can be expressed by the following Equation 1.

[Math. 1]

$$r = z \times \tan\theta \quad \text{(Equation 1)}$$

In addition, letting n be the index of refraction of an atmosphere, the numerical aperture NA of the condensing lens that condenses the laser beam L can be expressed by the following Equation 2, and the angle θ formed between the imaginary line and the optical axis O can be expressed by the following Equation 3 using the numerical aperture NA.

[Math. 2]

$$NA = n \times \sin\theta \quad \text{(Equation 2)}$$

[Math. 3]

$$\theta = \sin^{-1}\left(\frac{NA}{n}\right) \quad \text{(Equation 3)}$$

When Equation 3 is substituted into Equation 1, r can be expressed by the following Equation 4.

[Math. 4]

$$r = z \times \tan\left\{\sin^{-1}\left(\frac{NA}{n}\right)\right\} \quad \text{(Equation 4)}$$

The numerical aperture NA and the index of refraction n of the atmosphere among parameters included on the right side of Equation 4 can be grasped before the workpiece 11 is irradiated with the laser beam L. In addition, the interval z between the upper surface of the workpiece 11 and the imaginary condensing point FO can be set when the workpiece 11 is irradiated with the laser beam L.

Therefore, the width r of the peripheral region 17a which width is necessary for the laser beam L not to pass through the outer peripheral surface of the workpiece 11 can be calculated before the workpiece 11 is actually irradiated with the laser beam L. Then, the width of the peripheral region 17a is preferably set to be equal to or more than r thus calculated.

However, in a case where the power density of the laser beam applied to the workpiece 11 to form a peeling layer is very not high (for example, in a case where no ablation trace is formed even when the outer peripheral surface of the workpiece 11 is irradiated with the laser beam), the width of the peripheral region 17a may be set to be less than the above-described r.

On the other hand, the peripheral region 17a is a region in which a crack is intended to be developed from the boundary between the peripheral region 17a and the central region 17b to the outer peripheral surface of the workpiece 11 in a wafer peeling step to be described later. Therefore, the width of the peripheral region 17a is preferably not excessively large.

For example, the width of the peripheral region 17a is preferably set to be four times r or less, is more preferably set to be three times r or less, and is most preferably set to be twice r or less.

Figure 3:
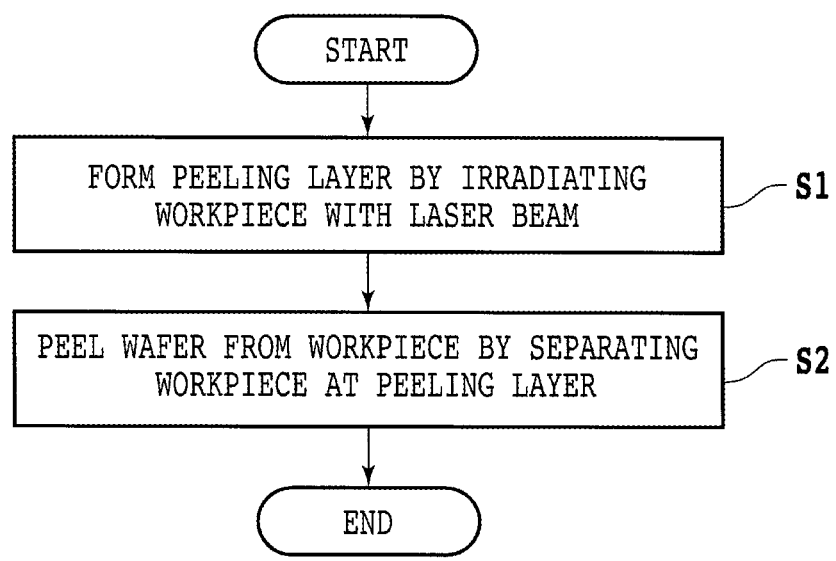
FIG. 3 is a flowchart illustrating an example of a wafer producing method.

FIG. 3 is a flowchart illustrating an example of a wafer producing method according to the present embodiment. In this method, first, a peeling layer is formed by irradiating the workpiece 11 with the laser beam (peeling layer forming step: S1).

Figure 4:
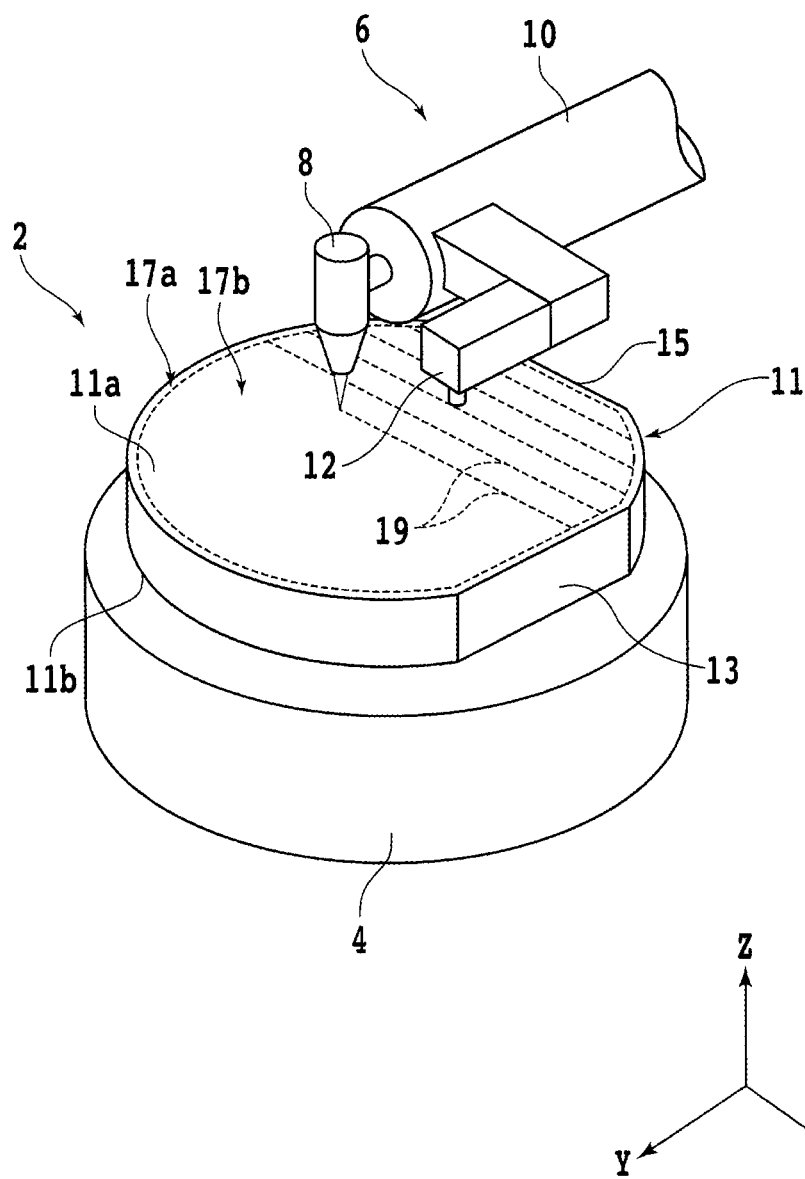
FIG. 4 is a perspective view schematically illustrating a laser irradiating apparatus for performing a peeling layer forming step and the workpiece.

FIG. 4 is a perspective view schematically illustrating a laser irradiating apparatus for performing the peeling layer forming step (S1) and the workpiece 11. Incidentally, an X-axis direction and a Y-axis direction illustrated in FIG. 4 are directions orthogonal to each other on a horizontal plane, and a Z-axis direction is a direction (vertical direction) orthogonal to the X-axis direction and the Y-axis direction.

The laser irradiating apparatus 2 illustrated in FIG. 4 includes a chuck table 4 that has a circular holding surface substantially parallel with the horizontal plane and which can hold the workpiece 11 by the holding surface. The chuck table 4 is coupled to a suction mechanism (not illustrated).

The suction mechanism has an ejector or the like. The suction mechanism can thereby generate a negative pressure in the holding surface of the chuck table 4. When the suction mechanism operates in a state in which the workpiece 11 is mounted on the holding surface, the workpiece 11 is sucked and held by the chuck table 4.

Further, the chuck table 4 is coupled to an X-axis direction moving mechanism (not illustrated) and a Y-axis direction moving mechanism (not illustrated). Each of the X-axis direction moving mechanism and the Y-axis direction moving mechanism, for example, includes a ball screw, a motor, and the like. When the X-axis direction moving mechanism and/or the Y-axis direction moving mechanism operates, the chuck table 4 moves along the X-axis direction and/or the Y-axis direction.

In addition, the chuck table 4 is coupled to a rotating mechanism (not illustrated). The rotating mechanism, for example, includes a spindle, a motor, and the like. When the rotating mechanism operates, the chuck table 4 rotates about a rotational axis. This rotational axis is a straight line passing through the center of the holding surface and along the Z-axis direction.

A head 8 of a laser beam irradiating unit 6 is provided above the chuck table 4. The head 8 is provided to a distal end (one end) portion of a coupling unit 10 that extends along the Y-axis direction. Incidentally, the head 8 houses an optical system of a condensing lens, a mirror, and the like, and the coupling unit 10 houses an optical system of a mirror and/or a lens or the like.

Another end portion of the coupling unit 10 is coupled to a Z-axis direction moving mechanism (not illustrated). The Z-axis direction moving mechanism, for example, includes a ball screw, a motor, and the like. When the Z-axis direction moving mechanism operates, the head 8 and the coupling unit 10 move along the Z-axis direction.

In addition, the laser beam irradiating unit 6 includes a laser oscillator (not illustrated) that generates a laser beam of a wavelength (for example, 1064 nm) passing through the workpiece 11. The laser oscillator, for example, has Nd:YAG or the like as a laser medium. When the laser oscillator generates the laser beam, the laser beam is applied to the holding surface side of the chuck table 4 via the optical systems housed in the coupling unit 10 and the head 8.

An imaging unit 12 that can image the holding surface side of the chuck table 4 is further provided to a side portion of the coupling unit 10. The imaging unit 12, for example, includes a light source such as a light emitting diode (LED), an objective lens, and an imaging element such as a charge coupled device (CCD) image sensor or a complementary metal oxide semiconductor (CMOS) image sensor. Then, the objective lens of the imaging unit 12 is provided at a position separated along the X-axis direction as viewed from the condensing lens housed in the head 8.

The peeling layer forming step (S1) using the laser irradiating apparatus 2 is performed in the following order, for example. First, the workpiece 11 is mounted on the holding surface of the chuck table 4 such that the top surface 11a is oriented upward. Next, the suction mechanism operates to suck and hold the workpiece 11 on the chuck table 4.

Next, the rotating mechanism rotates the chuck table 4 such that the secondary orientation flat 15 becomes parallel with the X-axis direction on the basis of an image of the top surface 11a of the workpiece 11 or the like which image is formed by imaging of the imaging unit 12. Next, the X-axis direction moving mechanism and/or the Y-axis direction moving mechanism moves the chuck table 4 such that the head 8 is positioned directly above a position of the central region 17b which position is in the vicinity of the boundary between the peripheral region 17a and the central region 17b of the workpiece 11.

Next, the optical system(s) of the head 8 and/or the coupling unit 10 is (are) set such that the condensing point of the laser beam applied from the laser beam irradiating unit 6 is positioned within the workpiece 11. For example, the Z-axis direction moving mechanism moves the head 8 and the coupling unit 10 such that an interval between the condensing lens housed in the head 8 and the top surface 11a of the workpiece 11 becomes a predetermined distance.

It is to be noted that such an optical system setting may be made in any timing before the irradiation of the workpiece 11 with the laser beam. For example, the optical system setting may be made prior to the rotation and movement of the above-described chuck table 4. In addition, such an optical system setting is made such that an interval between the condensing point of the laser beam and the top surface 11a of the workpiece 11 is slightly larger than the thickness of a wafer used to manufacture chips of semiconductor devices.

Next, the laser beam irradiating unit 6 applies the laser beam of the wavelength passing through the workpiece 11 while the X-axis direction moving mechanism moves the chuck table 4 such that the condensing point of the laser beam does not go out of the central region 17b. That is, the laser beam irradiating unit 6 irradiates the central region 17b with the laser beam while the workpiece 11 and the condensing point of the laser beam are moved relative to each other along the intersection line at which a plane parallel with the c-plane 11e of the workpiece 11 (single crystal SiC) and the top surface 11a intersect each other.

Next, similar application of the laser beam is repeated. Specifically, the laser beam is similarly applied to a linear part along the X-axis direction in the central region 17b which linear part is separated by a predetermined distance in the Y-axis direction from a linear part along the X-axis direction which linear part has been irradiated with the laser beam. A plurality of rows of modified portions 19 along the X-axis direction are thereby formed over the whole of the inside of the central region 17b.

Figure 5A:
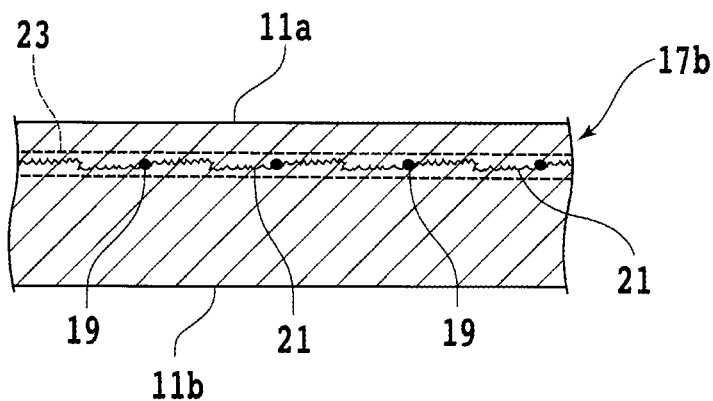
FIG. 5A is a sectional view schematically illustrating a central region of the workpiece after the peeling layer forming step.
Figure 5B:
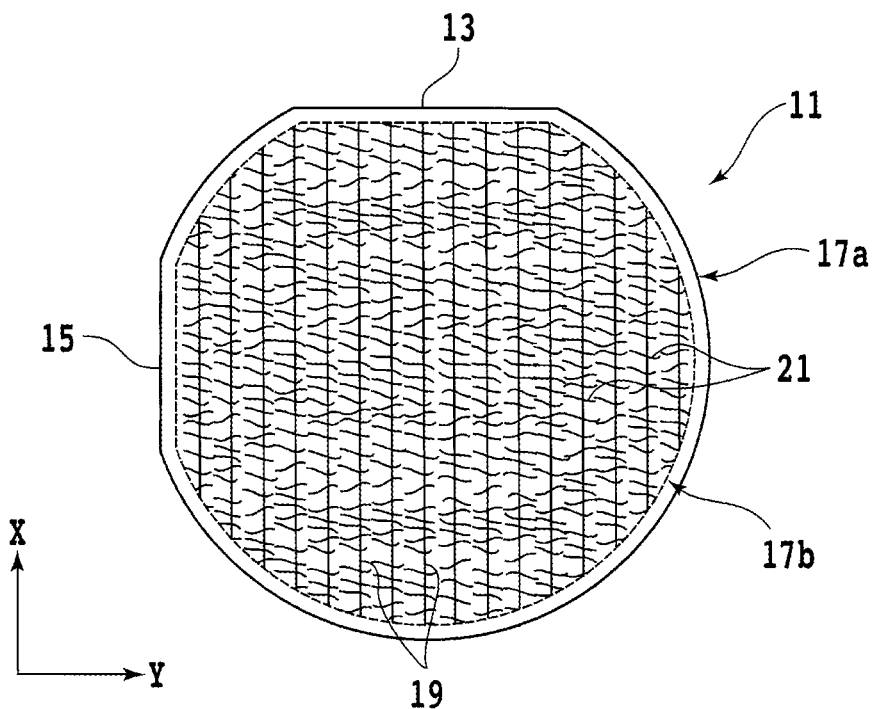
FIG. 5B is a diagram schematically illustrating the workpiece after the peeling layer forming step.

FIG. 5A is a sectional view schematically illustrating the central region 17b of the workpiece 11 after the peeling layer forming step (S1). FIG. 5B is a diagram schematically illustrating the workpiece 11 after the peeling layer forming step (S1).

As illustrated in FIG. 5A and FIG. 5B, when the modified portions 19 are formed in the peeling layer forming step (S1), cracks 21 can develop from the modified portions 19 along the c-plane 11e. A peeling layer 23 that has the modified portions 19 and the cracks 21 and is to be separated vertically by application of an external force to the workpiece 11 is thereby formed in the central region 17b.

Figure 6:
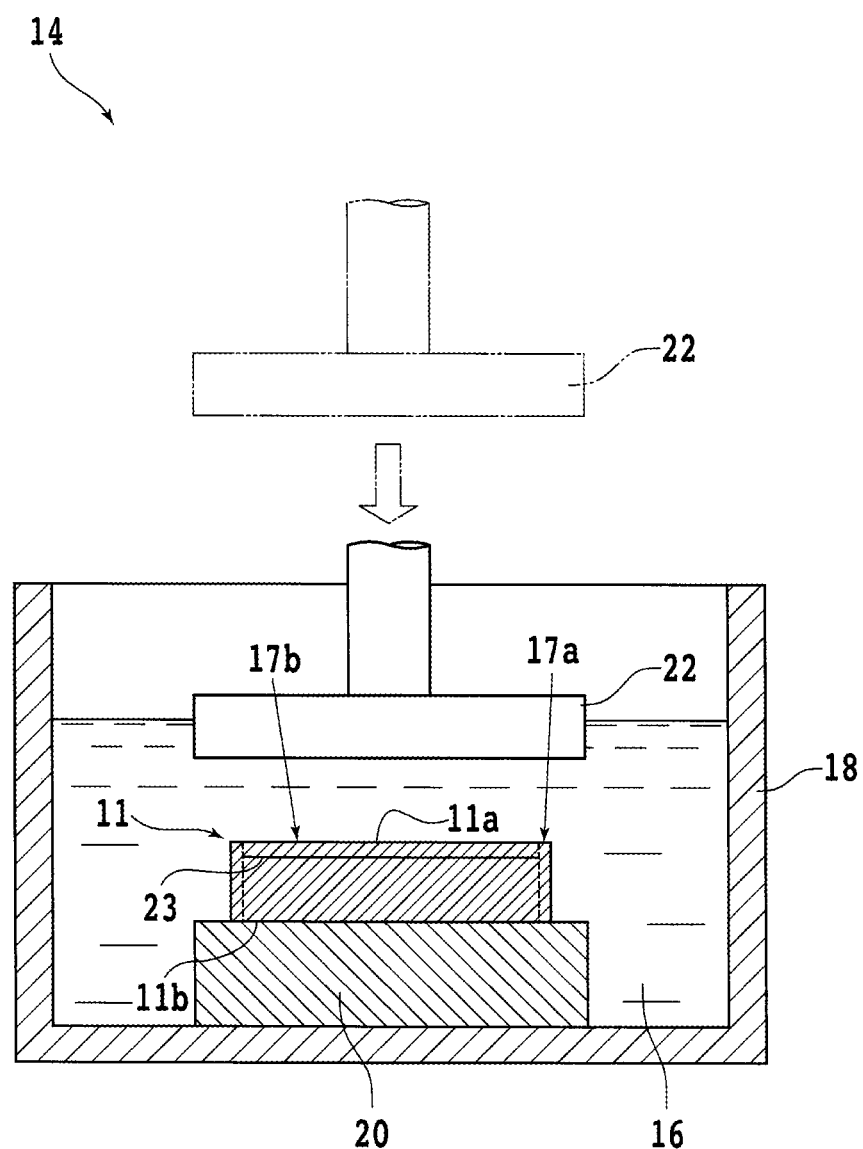
FIG. 6 is a sectional view schematically illustrating a separating apparatus for performing a wafer peeling step and the workpiece.

The method illustrated in FIG. 3 peels a wafer off from the workpiece 11 (wafer peeling step: S2) by separating the workpiece 11 at the peeling layer 23 after the peeling layer forming step (S1). FIG. 6 is a sectional view schematically illustrating a separating apparatus for performing the wafer peeling step (S2) and the workpiece 11.

The separating apparatus 14 illustrated in FIG. 6 has a liquid tank 18 that internally houses a liquid 16. A bottom portion of the liquid tank 18 is provided with a mounting table 20 on which to mount the workpiece 11. The workpiece 11 is mounted on the mounting table 20 in a state of being immersed in the liquid tank 18.

Further, the separating apparatus 14 has an ultrasonic irradiating unit 22 that can apply an ultrasonic wave. The ultrasonic irradiating unit 22 can, for example, be moved between a retracted position at which the ultrasonic irradiating unit 22 is separated from the liquid 16 and a driving position at which the bottom surface of the ultrasonic irradiating unit 22 is in contact with the liquid 16.

The wafer peeling step (S2) using the separating apparatus 14 is performed in the following order, for example. First, the ultrasonic irradiating unit 22 is positioned at the retracted position, and thereafter the workpiece 11 is mounted on the mounting table 20 such that the top surface 11a is oriented upward.

Next, the ultrasonic irradiating unit 22 is positioned at the driving position, and thereafter an ultrasonic wave is applied from the bottom surface of the ultrasonic irradiating unit 22. This ultrasonic wave is propagated in the liquid 16 and is applied to the workpiece 11.

An ultrasonic vibration (external force) is thereby applied to the workpiece 11, so that the cracks 21 formed in the peeling layer forming step (S1) further develop. Then, the cracks 21 develop not only in the central region 17b but also to the peripheral region 17a. As a result, the workpiece 11 is separated at the peeling layer 23, and a wafer is peeled off from the workpiece 11.

Incidentally, while FIG. 6 illustrates an embodiment in which the whole of the workpiece 11 mounted on the mounting table 20 is immersed in the liquid 16, the whole of the workpiece 11 may not be immersed in the liquid 16 in the wafer peeling step (S2).

In the separating apparatus 14, for example, a nozzle that supplies the liquid to the workpiece 11 may be provided in the vicinity of the ultrasonic irradiating unit 22. Then, in the wafer peeling step (S2), an ultrasonic vibration (external force) may be applied to the workpiece 11 by the ultrasonic irradiating unit 22 by applying the ultrasonic wave while the liquid is supplied from the nozzle to the workpiece 11.

The wafer producing method illustrated in FIG. 3 forms the peeling layer 23 by applying the laser beam only to the central region 17b of the workpiece 11 other than the peripheral region 17a extending inward from the peripheral edge of the workpiece 11 by a predetermined distance.

In this case, the application of the laser beam does not form the peeling layer 23 in the peripheral region 17a of the workpiece 11, and the formation of an ablation trace on the outer peripheral surface of the workpiece 11 is prevented. As a result, it is possible to reduce a probability of occurrence of chipping in the peripheral region of the wafer when the wafer peeled off from the workpiece 11 is subjected to a post-process (grinding, chemical mechanical polishing, edge trimming, chamfering, or the like).

Figure 7:
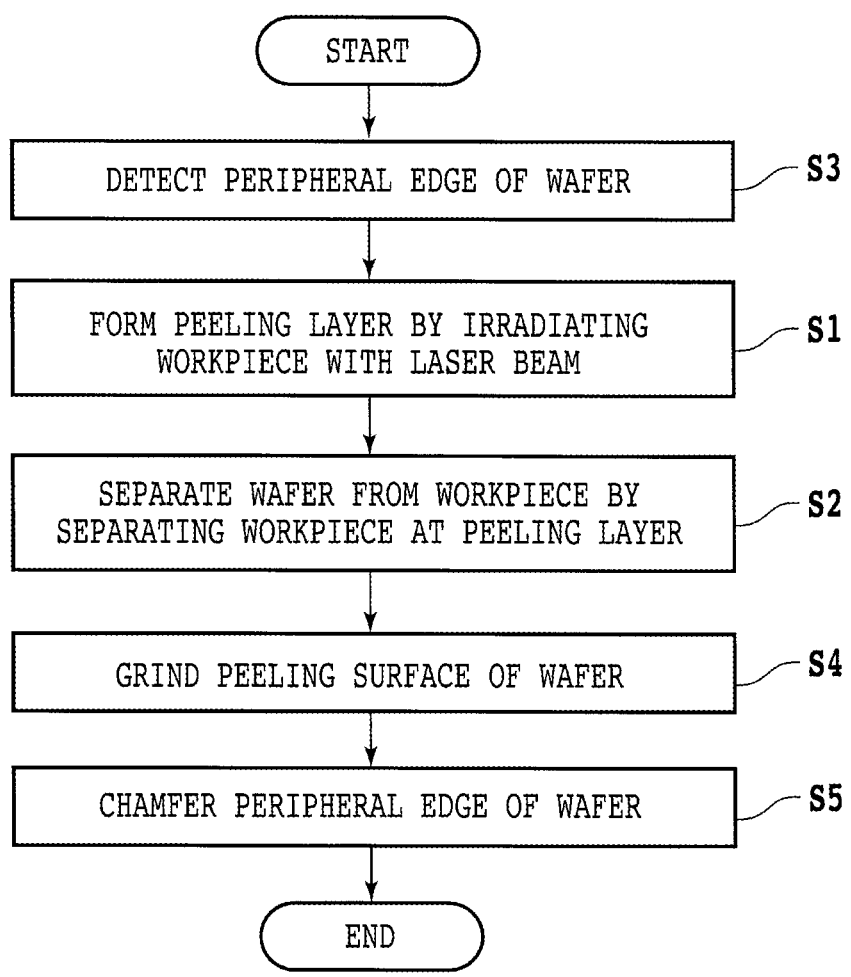
FIG. 7 is a flowchart illustrating another example of the wafer producing method.

It is to be noted that the wafer producing method illustrated in FIG. 3 is one aspect of the present invention, and that a wafer producing method having features different from this method is also included in the technical scope of the present invention. FIG. 7 is a flowchart schematically illustrating another example of the wafer producing method included in the technical scope of the present invention. Specifically, FIG. 7 is a flowchart illustrating a wafer producing method including other steps in addition to the peeling layer forming step (S1) and the wafer peeling step (S2) of the wafer producing method illustrated in FIG. 3.

The wafer producing method illustrated in FIG. 7 detects the peripheral edge of the workpiece 11 (peripheral edge detecting step: S3) before the peeling layer forming step (S1). The peripheral edge detecting step (S3) is, for example, performed on the basis of an image formed by the imaging unit 12 by imaging the top surface 11a of the workpiece 11 after the chuck table 4 of the laser irradiating apparatus 2 illustrated in FIG. 4 sucks and holds the workpiece 11.

In a case where the peripheral edge detecting step (S3) is performed, the peripheral region 17a extending inward from the peripheral edge of the workpiece 11 by a predetermined distance can be identified accurately. Therefore, the formation of the peeling layer 23 in the peripheral region 17a of the workpiece 11 by the application of the laser beam is prevented reliably. As a result, the probability of occurrence of chipping in the peripheral region of the wafer can be further reduced when the wafer peeled off from the workpiece 11 is subjected to a post-process.

Figure 8:
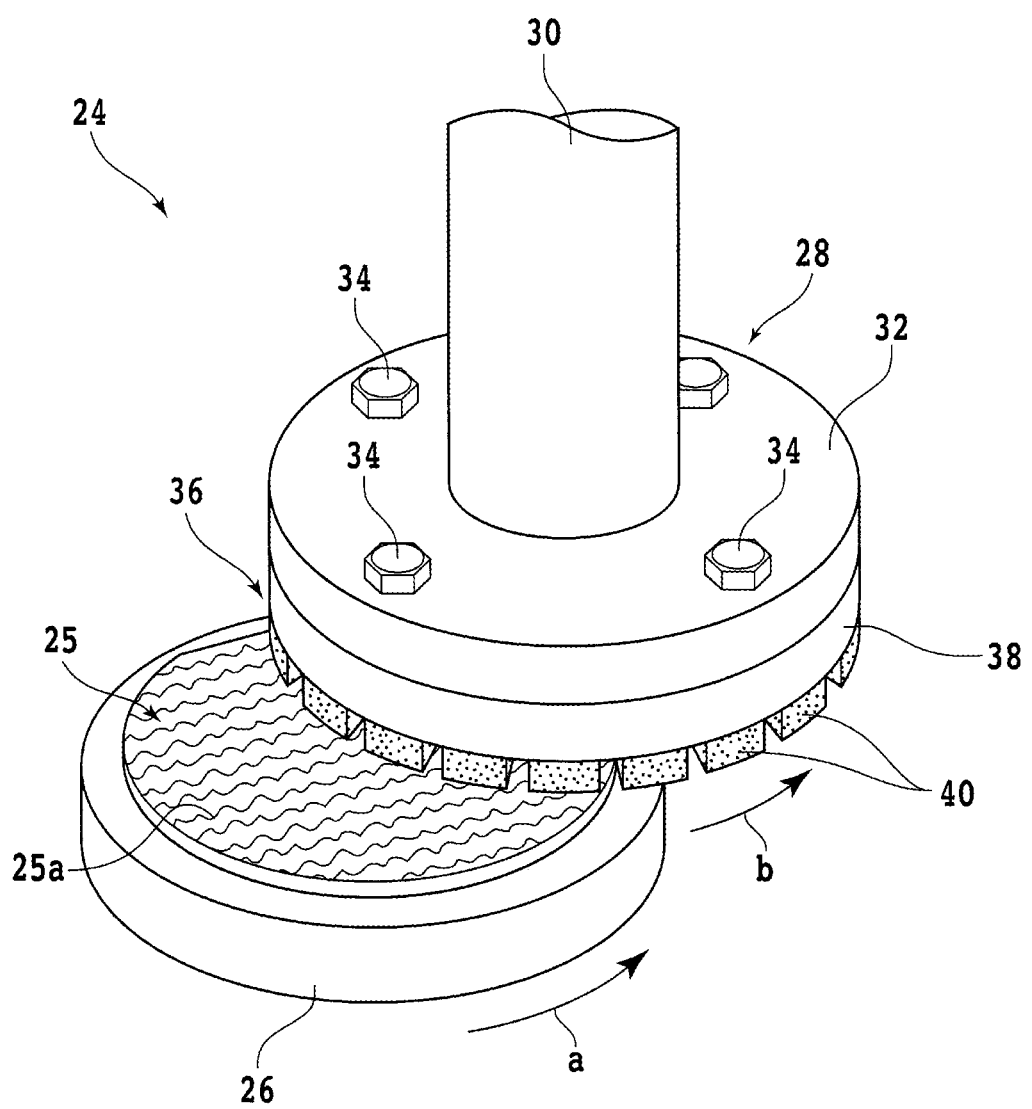
FIG. 8 is a perspective view schematically illustrating a grinding apparatus for performing a grinding step and a wafer peeled off from the workpiece.

In addition, after the wafer peeling step (S2), the wafer producing method illustrated in FIG. 7 grinds a peeling surface of the wafer peeled off from the workpiece 11 (surface of the wafer which surface is exposed due to the peeling of the wafer from the workpiece 11) (grinding step: S4). FIG. 8 is a perspective view schematically illustrating a grinding apparatus for performing the grinding step (S4) and the wafer peeled off from the workpiece 11.

The grinding apparatus 24 illustrated in FIG. 8 includes a chuck table 26 that has a holding surface in a shape corresponding to the side surface of a circular cone whose center slightly projects from an outer edge thereof and which can hold the wafer 25 by the holding surface. The chuck table 26 is coupled to a suction mechanism (not illustrated).

The suction mechanism has an ejector or the like. The suction mechanism can thereby generate a negative pressure in the holding surface of the chuck table 26. When the suction mechanism operates in a state in which the wafer 25 is mounted on the holding surface, the wafer 25 is sucked and held by the chuck table 26.

Further, the chuck table 26 is coupled to a horizontal direction moving mechanism (not illustrated). The horizontal direction moving mechanism, for example, includes a ball screw, a motor, and the like. When the horizontal direction moving mechanism operates, the chuck table 26 moves along a horizontal direction.

In addition, the chuck table 26 is coupled to a rotating mechanism (not illustrated). The rotating mechanism, for example, includes a spindle, a motor, and the like. When the rotating mechanism operates, the chuck table 26 rotates about a rotational axis along the direction of an arrow illustrated in FIG. 8. This rotational axis is a straight line passing through the center of the holding surface and along a vertical direction.

A grinding unit 28 is provided above the chuck table 26. The grinding unit 28 has a spindle 30 whose upper end portion is coupled to a motor. A disk-shaped wheel mount 32 is fixed to a lower end portion of the spindle 30.

The wheel mount 32 is provided with a plurality of openings (not illustrated) that penetrate the wheel mount 32 in an upward-downward direction. The plurality of openings are annularly arranged so as to be spaced from each other along the circumferential direction of the wheel mount 32.

A grinding wheel 36 is fitted to a lower portion of the wheel mount 32. The grinding wheel 36 includes an annular base 38. An upper portion of the base 38 is provided with a plurality of female threaded portions (not illustrated). Lower end portions of bolts 34 are screwed into the respective female threaded portions.

In addition, a plurality of grinding stones 40 arranged annularly so as to be spaced from each other along the circumferential direction of the base 38 are fixed to a lower end portion of the base 38. The lower surfaces of the plurality of grinding stones 40 are arranged at substantially the same height. These lower surfaces constitute a grinding surface of the grinding unit 28.

Further, the spindle 30 is coupled to a vertical direction moving mechanism (not illustrated). The vertical direction moving mechanism, for example, includes a ball screw, a motor, and the like. When the vertical direction moving mechanism operates, the spindle 30, the wheel mount 32, and the grinding wheel 36 move along the vertical direction.

The grinding step (S4) using the grinding apparatus 24 is performed in the following order, for example. First, in a state in which the chuck table 26 and the grinding unit 28 are separated from each other in both the horizontal direction and the vertical direction, the wafer 25 is mounted on the chuck table 26 such that the peeling surface (surface exposed due to the separation of the workpiece 11 at the peeling layer 23) 25a of the wafer 25 is oriented upward.

Next, the suction mechanism operates so as to suck and hold the wafer 25 on the chuck table 26. Next, the horizontal direction moving mechanism moves the chuck table 26 such that the rotational axis of the chuck table 26 coincides with an annular region in which the plurality of grinding stones 40 are arranged.

Next, the rotating mechanism rotates the chuck table 26, and the motor coupled to the upper end portion of the spindle 30 rotates the spindle 30, the wheel mount 32, and the grinding wheel 36.

Next, the vertical direction moving mechanism lowers the spindle 30, the wheel mount 32, and the grinding wheel 36 such that the peeling surface 25a of the wafer 25 and the lower surfaces of the plurality of grinding stones 40 come into contact with each other. The peeling surface 25a of the wafer 25 is thereby ground.

Here, the wafer 25 is separated from the workpiece 11 with the cracks 21 as a boundary, the cracks 21 developing along the c-plane 11e slightly inclined from the top surface 11a and the undersurface 11b. Therefore, minute irregularities are often formed on the peeling surface 25a of the wafer 25.

However, the above-described grinding step (S4) can remove the minute irregularities formed on the peeling surface 25a of the wafer 25. Performing the grinding step (S4) after the wafer forming step (S2) is therefore a preferable embodiment in the present invention.

Figure 9:
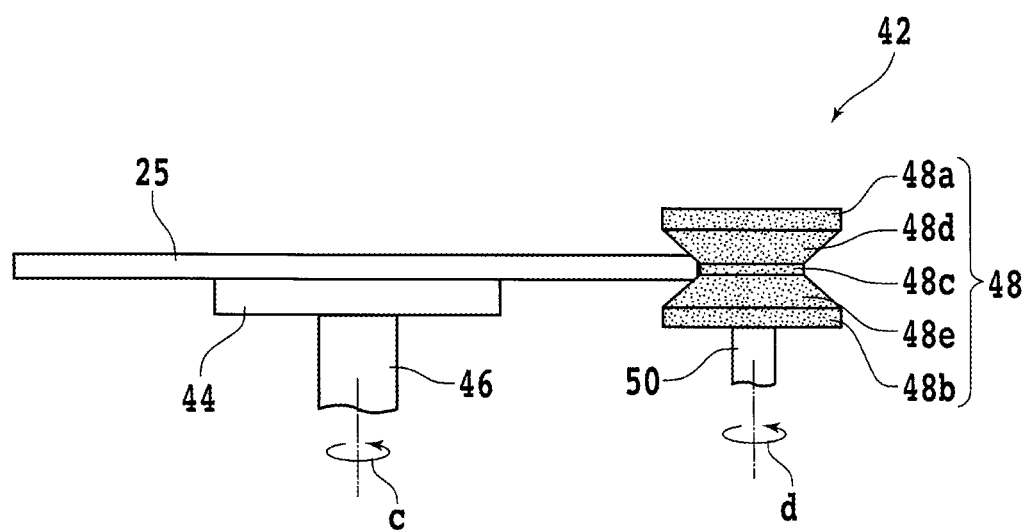
FIG. 9 is a side view schematically illustrating a chamfering apparatus for performing a chamfering step and the wafer peeled off from the workpiece.
Figure 10A:
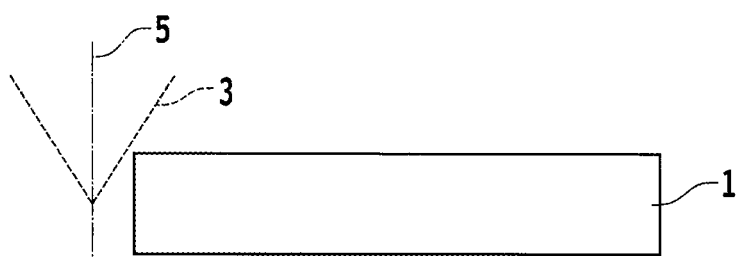
FIG. 10A is a diagram illustrating a state in which the vicinity of one end of an ingot is irradiated with a laser beam.
Figure 10B:
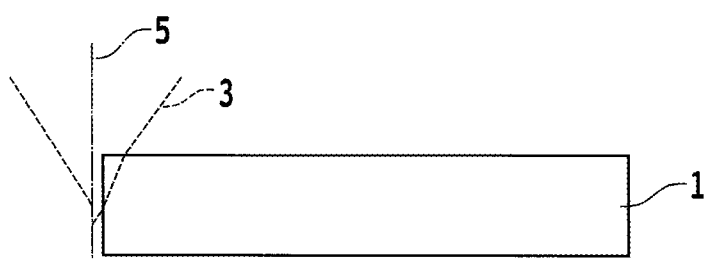
FIG. 10B is a diagram illustrating a state in which the vicinity of one end of the ingot is irradiated with the laser beam.
Figure 10C:
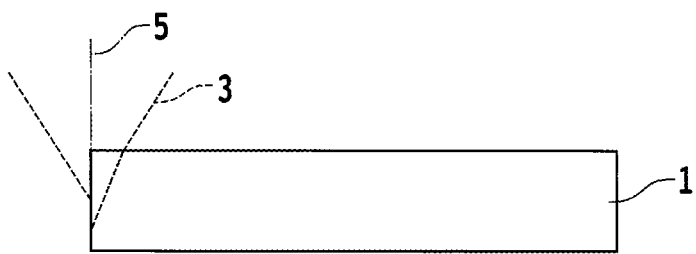
FIG. 10C is a diagram illustrating a state in which the vicinity of one end of the ingot is irradiated with the laser beam.
Figure 10D:
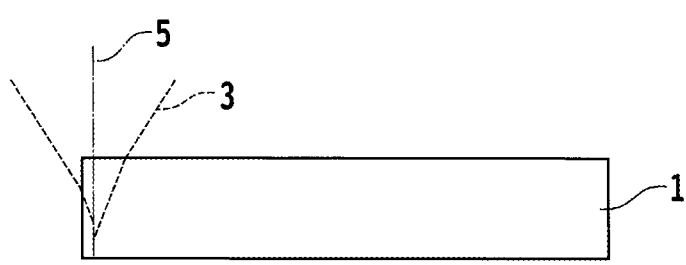
FIG. 10D is a diagram illustrating a state in which the vicinity of one end of the ingot is irradiated with the laser beam.
Figure 10E:
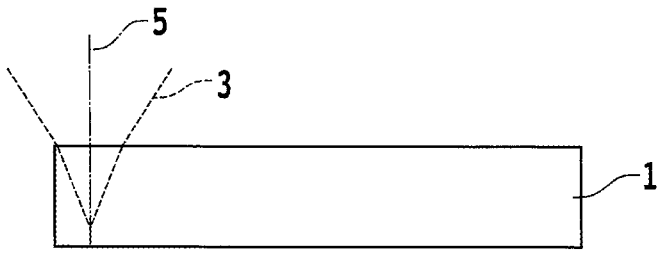
FIG. 10E is a diagram illustrating a state in which the vicinity of one end of the ingot is irradiated with the laser beam.

In addition, the wafer producing method illustrated in FIG. 7 chamfers the peripheral edge of the wafer 25 (chamfering step: S5) after the grinding step (S4). FIG. 9 is a side view schematically illustrating a chamfering apparatus for performing the chamfering step (S5) and the wafer 25.

The chamfering apparatus 42 illustrated in FIG. 9 includes a chuck table 44 that has a substantially parallel circular holding surface and which can hold the wafer 25 by the holding surface. Incidentally, the size (diameter) of the holding surface is smaller than the size (diameter) of the wafer 25. Therefore, the vicinity of the peripheral edge of the wafer 25 is not directly supported by the chuck table 44.

An upper end portion of a spindle 46 is fixed to a lower end portion of the chuck table 44. In addition, a motor (not illustrated) is coupled to a lower end portion of the spindle 46. When the motor operates, the chuck table 44 and the spindle 46 rotate about a rotational axis along the direction of an arrow c illustrated in FIG. 9. This rotational axis is a straight line passing through the center of the holding surface of the chuck table 44 and along the vertical direction.

Further, the chuck table 44 is coupled to a suction mechanism (not illustrated) via the spindle 46. The suction mechanism has an ejector or the like. The suction mechanism can thereby generate a negative pressure in the holding surface of the chuck table 44. When the suction mechanism operates in a state in which the wafer 25 is mounted on the holding surface, the wafer 25 is sucked and held by the chuck table 26.

In addition, the chuck table 44 is coupled to a horizontal direction moving mechanism (not illustrated) via the spindle 46. The horizontal direction moving mechanism, for example, includes a ball screw, a motor, and the like. When the horizontal direction moving mechanism operates, the chuck table 44 moves along the horizontal direction.

A grinding stone 48 is provided to a side of the chuck table 44. The grinding stone 48 includes an upper portion 48a and a lower portion 48b in a disk shape which portions are substantially equal in diameter to each other, a central portion 48c in a disk shape whose diameter is smaller than that of the upper portion 48a and the lower portion 48b, an upper side chamfering portion 48d in the shape of a circular truncated cone which chamfering portion is provided between the upper portion 48a and the central portion 48c so as to connect the upper portion 48a and the central portion 48c to each other, and a lower side chamfering portion 48e in the shape of a circular truncated cone which chamfering portion is provided between the lower portion 48b and the central portion 48c so as to connect the lower portion 48b and the central portion 48c to each other.

An upper end portion of a spindle 50 is fixed to a lower end portion of the lower portion 48b. In addition, a motor (not illustrated) is coupled to a lower end portion of the spindle 50. When the motor operates, the grinding stone 48 and the spindle 50 rotate about a rotational axis along the direction of an arrow d illustrated in FIG. 9. This rotational axis is a straight line passing through a center in a cross section in the horizontal direction of the grinding stone 48 and along the vertical direction.

Further, the spindle 50 is coupled to a vertical direction moving mechanism (not illustrated). The vertical direction moving mechanism, for example, includes a ball screw, a motor, and the like. When the vertical direction moving mechanism operates, the grinding stone 48 and the spindle 50 move along the vertical direction.

The chamfering step (S5) using the chamfering apparatus 42 is performed in the following order, for example. First, in a state in which the chuck table 44 and the grinding stone 48 are separated from each other in the horizontal direction, the wafer 25 is mounted on the chuck table 44.

Next, the suction mechanism operates so as to suck and hold the wafer 25 on the chuck table 44. Next, the vertical direction moving mechanism moves the grinding stone 48 and the spindle 50 such that the height of a center in the vertical direction of the central portion 48c of the grinding stone 48 and the height of a center in the vertical direction of the wafer 25 coincide with each other.

Next, the motor coupled to the lower end portion of the spindle 46 rotates the chuck table 44 and the spindle 46, and the motor coupled to the lower end portion of the spindle 50 rotates the grinding stone 48 and the spindle 50.

Next, the horizontal direction moving mechanism moves the chuck table 44 and the spindle 46 such that the peripheral edge of the wafer 25 comes into contact with the upper side chamfering portion 48*d* and the lower side chamfering portion 48*e* of the grinding stone 48. The peripheral edge of the wafer 25 is thereby chamfered.

Here, the wafer 25 is peeled from the workpiece 11 where the peeling layer 23 including the modified portions 19 and the cracks 21 is not formed in the peripheral region 17*a*. There is consequently a low probability that the modified portions 19 and the cracks 21 exist also in the vicinity of the peripheral edge of the wafer 25. Hence, the wafer 25 is a preferable wafer as a wafer whose peripheral edge is to be chamfered.

It is to be noted that the wafer producing method illustrated in FIG. 7 may not perform one or two of the peripheral edge detecting step (S3), the grinding step (S4), and the chamfering step (S5). In other words, the technical scope of the present invention includes a wafer producing method that performs the peeling layer forming step (S1) and the wafer peeling step (S2) and one or two of the peripheral edge detecting step (S3), the grinding step (S4), and the chamfering step (S5).

Besides, structures, methods, and the like according to the embodiment and the modification described above can be modified and implemented as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing, from a workpiece that is a single crystal SiC ingot or a single crystal SiC wafer and has a first surface and a second surface opposed to the first surface, a wafer having a thickness less than an interval between the first surface and the second surface, the wafer producing method comprising:
    a peeling layer forming step of positioning, within the workpiece, a condensing point of a laser beam of a wavelength passing through the workpiece, applying the laser beam while moving the workpiece and the condensing point relative to each other along an intersection line at which a plane parallel with a c-plane of the workpiece and the first surface intersect each other, and forming a peeling layer including a modified portion and a crack extending from the modified portion along the c-plane; and
    a wafer peeling step of peeling the wafer from the workpiece by separating the workpiece at the peeling layer,
    the peeling layer forming step applying the laser beam only in a state in which the condensing point is positioned in a central region of the workpiece other than a peripheral region extending inward from a peripheral edge of the workpiece by a predetermined distance.

2. The wafer producing method according to claim 1, further comprising:
    a peripheral edge detecting step of detecting the peripheral edge of the workpiece by imaging the first surface side of the workpiece by an imaging unit before the peeling layer forming step.

3. The wafer producing method according to claim 1, further comprising:
    a grinding step of grinding a peeling surface of the wafer, the peeling surface being exposed by peeling the wafer from the workpiece, after the wafer peeling step.

4. The wafer producing method according to claim 2, further comprising:
    a grinding step of grinding a peeling surface of the wafer, the peeling surface being exposed by peeling the wafer from the workpiece, after the wafer peeling step.

5. The wafer producing method according to claim 1, further comprising:
    a chamfering step of chamfering the peripheral edge of the wafer after the wafer peeling step.

6. The wafer producing method according to claim 2, further comprising:
    a chamfering step of chamfering the peripheral edge of the wafer after the wafer peeling step.

7. The wafer producing method according to claim 3, further comprising:
    a chamfering step of chamfering the peripheral edge of the wafer after the wafer peeling step.

8. The wafer producing method according to claim 4, further comprising:
    a chamfering step of chamfering the peripheral edge of the wafer after the wafer peeling step.

* * * * *